United States Patent [19]

Brasen et al.

[11] Patent Number: 4,725,877
[45] Date of Patent: Feb. 16, 1988

[54] METALLIZED SEMICONDUCTOR DEVICE INCLUDING AN INTERFACE LAYER

[75] Inventors: Daniel Brasen, Lake Hiawatha; Ronald H. Willens, Warren, both of N.J.

[73] Assignee: American Telephone and Telegraph Company, AT&T Bell Laboratories, Murray Hill, N.J.

[21] Appl. No.: 850,978

[22] Filed: Apr. 11, 1986

[51] Int. Cl.$^4$ .................... H01L 23/48; H01L 45/00; H01L 29/04

[52] U.S. Cl. ........................................ 357/71; 357/2; 357/4; 357/59; 357/65; 357/67; 357/68; 428/620; 428/660

[58] Field of Search ............... 357/71 R, 71 S, 2, 67, 357/68, 65, 59 B, 4, 4 S, 4 L; 428/660, 620

[56] References Cited

U.S. PATENT DOCUMENTS

| | | | |
|---|---|---|---|
| 3,657,029 | 4/1972 | Fuller | 156/11 |
| 3,881,884 | 5/1975 | Cook et al. | 29/590 |
| 4,017,890 | 4/1977 | Howard et al. | 357/67 |
| 4,135,292 | 1/1979 | Jaffe et al. | 357/2 |

FOREIGN PATENT DOCUMENTS 56-165354 12/1981 Japan ....................... 357/2
57-71175  5/1982 Japan ....................... 357/2

OTHER PUBLICATIONS

IBM, "Ohmic Contacts to Semiconductor Devices Using Barrier Layers of Aluminum and Titanium", IBM Technical Disclosure Bulletin, vol. 28, No. 4, Sep. 1985.

Wiley et al, "Amorphous Metallizations for High Temperature Semiconductor Device Applications", IEEE Transactions on Industrial Electronics, vol. IE-29, No. 2, May 1982.

Suni and Nicolet, "Stability of Amorphous Fe-W Alloys in Multilayer Metallizations on Silicon", Thin Solid Films, 107 (1983), pp. 73-80.

Primary Examiner—J. Carroll
Assistant Examiner—Ngan Ngo
Attorney, Agent, or Firm—Peter A. Businger

[57] ABSTRACT

Structures of alternating amorphous layers of titanium and a semiconductor material serve as effective interface layers between an insulator or semiconductor material and an aluminum metallization material in semiconductor devices. Such structures effectively serve to minimize interdiffusion during device manufacture without undue increase in electrical contact resistance during device operation.

12 Claims, 1 Drawing Figure

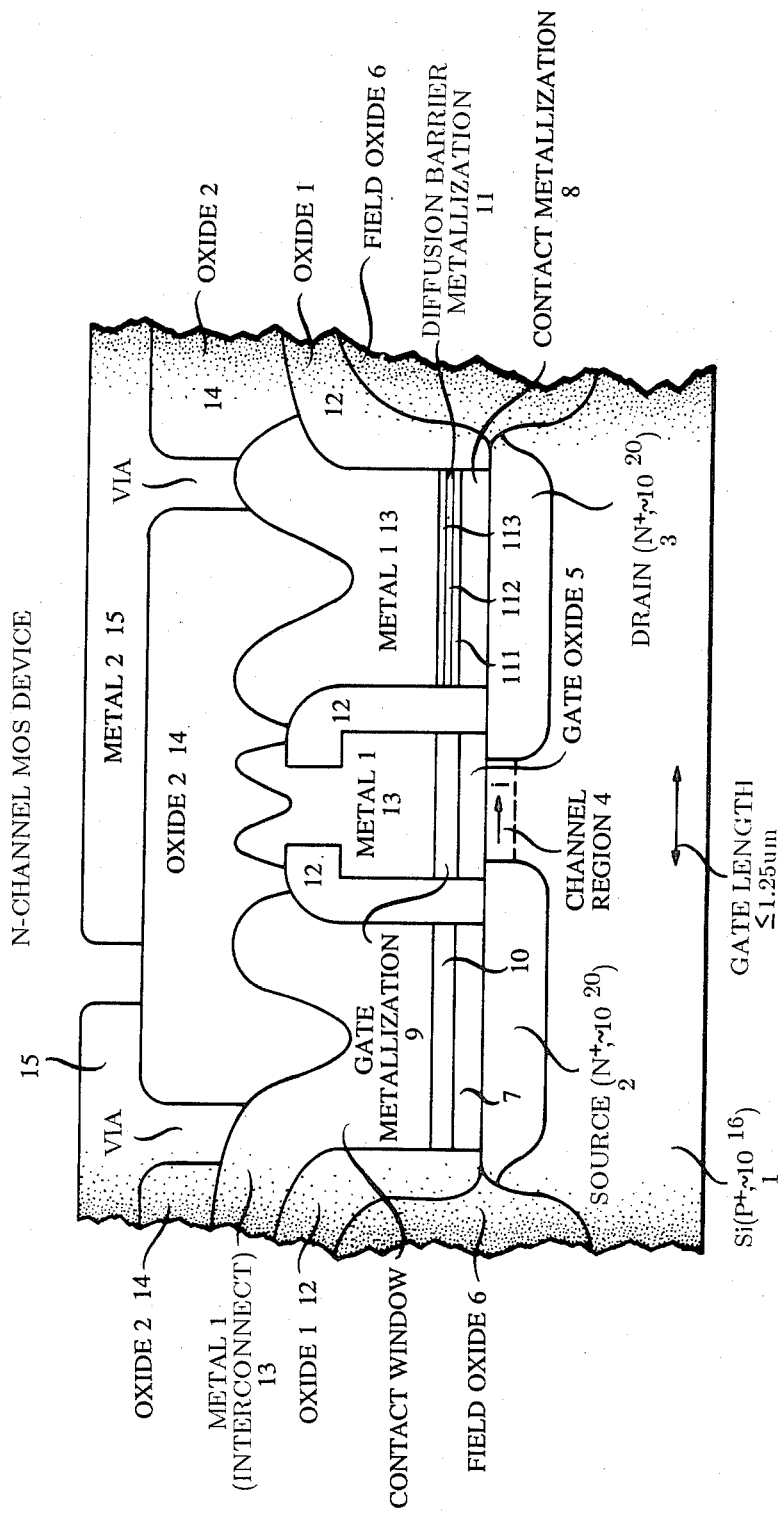

METALLIZED SEMICONDUCTOR DEVICE INCLUDING AN INTERFACE LAYER

TECHNICAL FIELD

The invention is concerned with devices comprising an electrically conducting interface or contact layer between metal and semiconductor materials.

BACKGROUND OF THE INVENTION

Integrated device technology depends heavily on the use of metallization layers and the patterning of such layers on semiconductor and insulator materials; typically, such materials are doped or undoped silicon, gallium arsenide, other binary, ternary, or quaternary III-V or II-VI semiconductor materials, or insulator materials such as, e.g., silica, alumina, and polymeric layers. Familiar metallization materials may be selected, e.g., from the group of noble metals; see, e.g., U.S. Pat. No. 3,881,884, issued May 6, 1975 to H. C. Cook et al, disclosing the manufacture of a composite conductive layer comprising an exposed layer of gold, platinum, palladium, iridium, rhodium, ruthenium, or osmium, underlying non-noble conductor material being separated from an insulating substrate by means of a titanium anti-diffusion layer.

A method for patterning a multi-layer metallization of platinum, palladium, rhodium, ruthenium, osmium, or iridium is disclosed in U.S. Pat. No. 3,657,029, issued Apr. 18, 1972 to C. R. Fuller; there, a layer of titanium or chromium is used as a mask material.

Popular also is the use of aluminum and aluminum alloys as relatively inexpensive alternatives to noble metals; for example, U.S. Pat. No. 4,017,890, issued Apr. 12, 1977 to J. K. Howard et al. discloses aluminum and aluminum-copper conductor stripe metallizations.

Typically, when aluminum or aluminum alloys are used for silicon device metallization, a contact material is placed between doped silicon source regions, doped silicon drain regions, and silicon oxide gate regions on the one hand, and the aluminum-containing interconnect metallization. Moreover, it has been found desirable to interpose an interface material between contact and interconnect metallizations; such interface material has desirably low resistivity and acts as a barrier against interdiffusion during device manufacture.

SUMMARY OF THE INVENTION

It has been discovered that structures consisting of alternating amorphous layers of titanium and a semiconductor material are suitable as contact and interface layers in device manufacture where aluminum or aluminum alloy metallization are being used.

BRIEF DESCRIPTION OF THE DRAWING

The FIGURE shows, enlarged and in schematic cross section, an integrated semiconductor device comprising three interface layers in accordance with the invention.

DETAILED DESCRIPTION

The FIGURE schematically shows a cross section of an n-channel metal-oxide semiconductor device comprising a body of silicon 1 which is doped p-plus except for a source region 2 and a drain region 3 which are doped n-plus. A channel region 4 is covered with a gate oxide layer 5, and field oxide regions 6 adjoin the source region 2 and the drain region 3. A source contact layer 7 is on the source region 2, a drain contact layer 8 is on the drain region 3, and a gate contact layer 9 is on the gate oxide layer 5. Interface layers 10 and 11 are on the contact layers 7 and 8, respectively; a first insulating oxide layer 12 insulates the field oxide regions 6 as well as the gate contact layer 9; and a first interconnect metallization 13 is shown in contact with layers 9, 10, and 11. A second insulating oxide layer 14 is on the interconnect metallization layer 13, and a second interconnect metallization layer 15 on the second insulating oxide layer 14 is in contact with the first interconnect metallization layer 13 through etched windows in the second insulating oxide layer 14.

In accordance with the invention a contact or interface layer such as, e.g., gate contact layer 9, interface layer 10, and interface layer 11 is made as a structure of alternating amorphous layers of titanium and a semiconductor material. This is illustrated in the FIGURE in that layer 11 is shown as consisting of amorphous semiconductor layer 111, amorphous titanium layer 112, and amorphous semiconductor layer 113. (It is understood that, especially under conditions of processing at elevated temperatures, there will be a certain amount of alloy formation at layer interfaces. Such partial alloying does not significantly reduce the anti-interdiffusion efficacy of a layered structure and may contribute to desired low contact resistance.)

Titanium layers preferably comprise at least 99 weight percent titanium, the remaining at most 1 percent being made up of impurities such as, e.g., iron or nickel. In the interest of essentially amorphous structure, titanium layer thickness does not exceed approximately 8 nanometers and preferably 5 nanometers. For the sake of ease of deposition of a continuous layer, preferred thickness is at least 0.1 nanometer.

Semiconducting layers may consist of undoped, p-doped, or n-doped semiconductor material, and such material may be elemental, compound, or mixed. Silicon is considered particularly suitable in combination with titanium for interface structures between silicon substrates and aluminum metallizations. Thickness of silicon layers is less critical than titanium layer thickness; however, thicknesses greater than 10 nanometers are considered as uneconomical with respect to the purpose of the invention. Also, for the sake of continuity of a deposited layer, preferred thickness is at least 0.1 nanometer.

The number of periods of alternating layers may be from 1 or, preferably, 2 to 500, greater numbers giving increased protection against interdiffusion and also greater contact resistance.

Structures in accordance with the invention are intended primarily for the protection against interdiffusion between aluminum metallizations and semiconductor or insulator materials during device manufacture involving processing at elevated temperatures. In this respect, semiconductor device processing may involve heating to temperatures above 200 degrees C. Aluminum metallization typically are made of aluminum which has been alloyed with a small amount of copper, preferred aluminum content being at least 90 weight percent. Especially important among insulator and semiconductor materials are oxidized silicon and n- or p-doped silicon.

For the sake of minimized contact resistance during subsequent device operation, localized short-term heating can be used as part of device processing to raise the temperature of a layered structure so as to allow for at least partial interdiffusion of the semiconductor and titanium layers and, possibly, for stoichiometric compound formation. Such localized heating may be effected, e.g., by infrared laser irradiation.

EXAMPLE 1

Alternating layers of titanium and silicon were deposited by electron-beam evaporation on a p-type, {001} silicon substrate which had been spin-dried after cleaning in a 1:100-solution of hydrofluoric acid in water. During deposition the substrate temperature was approximately 5 degrees C., and deposition was in vacuum having a residual atmosphere consisting essentially of hydrogen at a partial pressure of approximately $5 \times 10^{-9}$ torr (approximately $665 \times 10^{-9}$ Pa). The electron guns were held to a potential of approximately 9 kV, and deposition rate wa approximately 0.08 nanometer/sec. Individual layers of titanium and silicon had approximate respective thicknesses of 1 nanometer and 2 nanometers, and a structure having 5 periods of alternating titanium and silicon layers was deposited. The structure was then metallized with a layer of aluminum-copper having a thickness of approximately 120 nanometers.

The deposited structure was annealed at a temperature of approximately 450 degrees C., and the annealed structure was examined by means of Rutherford back-scattering and X-ray analysis. Excellent preservation of the layered structure was observed. The structure was then annealed at a temperature of approximately 550 degrees C., and, again, preservation of the structure was observed.

For the sake of comparison, a prior-art tungsten interdiffusion barrier layer was similarly annealed. While such tungsten barrier layer retained its integrity after annealing at a temperature of 450 degrees C., annealing at 550 degrees C. resulted in its interdiffusion and reaction with silicon of the substrate and aluminum of the metallization.

EXAMPLE 2

The procedure described above in Example 1 was followed except that deposited layers had a thickness of 2 nanometers for titanium as well as for silicon, and that the deposited structure had 10 periods of alternating layers of titanium and silicon. Resistance to interdiffusion was as described in Example 1.

What is claimed is:

1. Device comprising a body of semiconductor material and an electrical conductor element which consists of a material which comprises aluminum in an amount of at least 90 weight percent,
CHARACTERIZED IN THAT, between said body and said conductor element, there is a structure of alternating, essentially amorphous, first and second layers of
   first material which consists essentially of titanium, and
   second material which consists essentially of semiconductor material,
   the thickness of said first layers being less than or equal to 8 nanometers.

2. Device of claim 1 in which said first material comprises titanium in an amount greater than or equal to 90 weight percent.

3. Device of claim 1 in which said second material is essentially the same in all of said second layers.

4. Device of claim 1 in which said body consists essentially of silicon.

5. Device of claim 1 in which said second material consists essentially of silicon.

6. Device of claim 1 in which the material of said conductor element comprises copper.

7. Device of claim 1 in which said second material is essentially in elemental form.

8. Device of claim 1 in which said second material is essentially in compound form.

9. Device of claim 1 in which said second material is a mixture.

10. Device of claim 1 in which said structure is on a source region.

11. Device of claim 1 in which said structure is on a drain region.

12. Device of claim 1 in which said structure is on a gate insulating layer.

* * * * *